(12) United States Patent
Sugihara

(10) Patent No.: US 6,406,991 B2
(45) Date of Patent: Jun. 18, 2002

(54) METHOD OF MANUFACTURING A CONTACT ELEMENT AND A MULTI-LAYERED WIRING SUBSTRATE, AND WAFER BATCH CONTACT BOARD

(75) Inventor: Osamu Sugihara, Kofu (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 09/748,022

(22) Filed: Dec. 27, 2000

(30) Foreign Application Priority Data

Dec. 27, 1999 (JP) .......................................... 11-369259

(51) Int. Cl.⁷ .............................................. H01L 21/44
(52) U.S. Cl. .................. 438/613; 438/15; 438/612; 438/622; 438/625; 438/627; 438/636; 438/637; 438/677; 438/710; 438/712; 438/714; 438/722; 438/725; 438/906; 438/963; 228/180.21; 228/180.22; 510/175
(58) Field of Search ......................... 438/15, 612, 613, 438/637, 677, 710, 725, 906, 963, 712, 714, 722, 622, 625, 627, 636; 228/180.21, 180.22; 510/175

(56) References Cited

U.S. PATENT DOCUMENTS

| | | | | | |
|---|---|---|---|---|---|
| 5,681,780 A | * | 10/1997 | Mihara et al. | ............... | 437/228 |
| 5,762,813 A | * | 6/1998 | Takiyama et al. | ............. | 216/67 |
| 5,770,523 A | * | 6/1998 | Hung et al. | ................. | 438/725 |
| 5,798,303 A | * | 8/1998 | Clampitt | ..................... | 438/696 |
| 5,858,878 A | * | 1/1999 | Toda | ......................... | 438/725 |
| 5,925,577 A | * | 7/1999 | Solis | ......................... | 438/725 |
| 6,232,219 B1 | * | 5/2001 | Blalock et al. | ............. | 438/637 |

FOREIGN PATENT DOCUMENTS

| JP | 07-231019 | 8/1995 |
|---|---|---|
| JP | 08-180757 | 7/1996 |

* cited by examiner

Primary Examiner—John F. Niebling
Assistant Examiner—David A. Zarneke
(74) Attorney, Agent, or Firm—Sughrue Mion, PLLC

(57) ABSTRACT

In a method of manufacturing a contact element, provision is made of a laminated body which has an insulating film, an electrically conductive layer stacked on the insulating film, and bump holes opened. A treatment is carried out so as to remove organic materials and the like from an interior of the bump holes and/or a surface of the insulating film before bumps are formed on the bump holes. The treatment may be a plasma treatment or an X-ray irradiation.

15 Claims, 4 Drawing Sheets

FIG. 4A
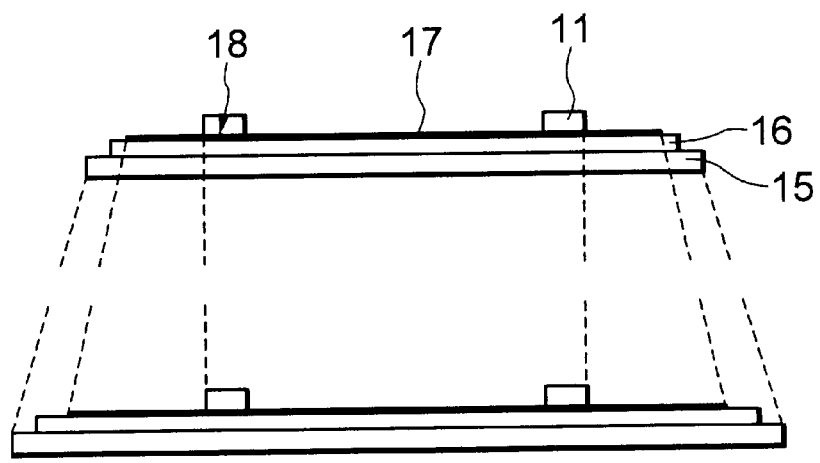
FIG. 4B
FIG. 4C
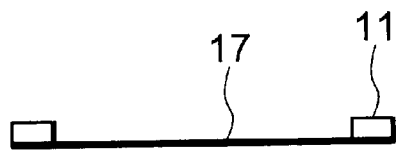

METHOD OF MANUFACTURING A CONTACT ELEMENT AND A MULTI-LAYERED WIRING SUBSTRATE, AND WAFER BATCH CONTACT BOARD

BACKGROUND OF THE INVENTION

1. Field of the Invention

The present invention relates to a method of manufacturing a contact element and a multi-layered wiring substrate, both of which form part of a wafer batch contact board that can be used to check or test, within only one step, numerous semiconductor devices on a wafer.

2. Description of the Related Art

Testing or checking numerous semiconductor devices on a wafer may be generally divided into a product test (electric property test) carried out by means of a probe card, and a burn-in test for assuring reliability after the product test.

Here, the burn-in test is a sort of screening test for removing semiconductor devices with inherent defects, or devices which cause failure due to irregularity in manufacturing process and depending on time and stress. In fact, the burn-in test may be referred to as a heat accelerating test, which is different from the device electric property test using a probe card.

The burn-in test is usually conducted after the electric property test which is performed for each chip by means of a probe card. In the burn-in test, a wafer is cut into chips through dicing process, and the test is performed for each package containing the chips. Thus, such a burn-in test may be called one chip burn-in system and is high at its cost. In order to solve this problem, there has been developed and put into practical use a wafer batch contact board (burn-in board) which can be used to carry out a burn-in test of numerous semiconductor devices formed on a wafer (Japanese Unexamined Patent Application Publication No. 7-231019) in only one step. A wafer batch burn-in system using the wafer batch contact board is considered to be an important technique, since it can be carried out at a low cost and is useful for putting into practical use a recently developed new techniques called bare chip shipping and bare chip mounting.

The wafer batch contact board is different from a conventional probe card, since the wafer batch contact board has higher requirements than those of the conventional probe card. This is because the wafer batch contact board can be used to check numerous chips formed on a wafer in only one step and can also be used in a heating test. If the wafer batch contact board is put into practical use, it is possible to carry out, on the base of wafer batch, the product examination (electric property test) formerly conducted by means of a conventional probe card.

FIG. 1 is an explanatory view showing in detail an example of the wafer batch contact board.

The wafer batch contact board, as shown in FIG. 1, comprises a multi-layered wiring substrate 20 for use in a wafer batch contact board (hereinafter, it is simply referred to as multi-layered wiring substrate), and a contact element 10 fixed on the multi-layered wiring substrate 20 through an anisotropic electrically conductive rubber sheet 30.

The contact element 10 has a contact portion for directly contacting an examined element. Specifically, the contact element 10 is located in the vicinity of an insulating film (membrane) 12, on one side of which there are formed a plurality of bumps 13, on the other side of which there are formed a plurality of pads 14. In particular, the insulating film 12 is spread over a ring 11 having a low coefficient of thermal expansion so as to avoid a dislocation which will possibly be caused due to a thermal expansion. The bumps 13 are provided in positions corresponding to the pads formed on the edge or center lines of all semiconductor devices (chips) on the wafer 40 (one chip has approximately 600 to 1000 pins, so that the number of the pads formed on the wafer are equal to a number calculated by multiplying the above number of the pins with the total number of the chips). In this way, the same number of the bumps 13 are located in positions corresponding to the positions of the pads 14 (having the same number as the bumps 13).

The multi-layered wiring substrate 20 has a wiring structure formed on an insulating substrate for supplying a predetermined burn-in test signal through the pads 14 to various bumps 13 independently located on the membrane 12. However, since the wiring structure on the multi-layered wiring substrate 20 is relatively complex, a plurality of wiring layers have to be laminated one upon another through a plurality of commonly used insulating films. Further, the multi-layered wiring substrate 20 employs an insulating substrate having a low coefficient of thermal expansion, so that it is possible to avoid a connection failure which will otherwise be caused due to a positional deviation (caused by thermal expansion) relative to the pads 14 on the membrane 12.

The anisotropic electrically conductive rubber sheet 30 is made of an elastomer (consisting of a silicon resin, with metallic particles buried in the electrode portions of the pads along their electrically conducting directions) having an electric conductivity in only directions which are perpendicular to the main surface thereof. Specifically, the anisotropic electrically conductive rubber sheet 30 is connected with terminals (not shown) formed on the multi-layered wiring substrate 20 and the pads 14 formed on the membrane 12. In particular, the anisotropic electrically conductive rubber sheet 30, by virtue of projections (not shown) formed on the surface thereof, can get in contact with the pads 14 formed on the membrane 12, so that it is possible to absorb some concave and convex portions on the surface of the semiconductor wafer 40 and irregularities in the height of the bumps 13, thereby ensuring an exact connection between the pads formed on the semiconductor wafer and the bumps formed on the membrane 12.

A contact element partially forming the above-described wafer batch contact board, as shown in FIG. 2A, may be produced by at first forming a laminated body 4 including an insulating film 1 (made of polyimide or the like) and an electrically conductive layer 2 (made of copper or the like). Then, an excimer laser is used to perform a laser treatment to form a plurality of bump holes 1a extending from the surface of the insulating film 1 to the electrically conductive layer 2. Afterwards, one of plating electrodes is connected to the electrically conductive layer 2 so as to carry out an electrolytic plating of Ni or the like. In this way, as shown in FIG. 2B, the plating material will grow to fill the bump holes 1a, and once the plating material reaches the surface of the polyimide film 1, it will spread equally in every direction around each bump hole 1a, thereby forming a plurality of bumps 3 consisting of hard Ni alloy.

However, an insulating resin film usually has a water rejection property and thus is not easy to be wetted by water. Moreover, since each of the bump holes has an extremely small diameter and since the bump holes are considerably deep, it is difficult for the plating liquid to reach the bottom of each bump hole. If the plating liquid fails to completely fill the bump holes by arriving at the bottoms thereof, the desired bumps will not grow or the growth is not acceptable. As a result, products containing ungrown bumps or improperly grown bumps have to be deemed as defective products.

Moreover, in the case where the surface of the insulating film is difficult to be wetted by the plating liquid, air bubbles are likely to attach to the surface of the insulating film. In fact, such kind of air bubbles are not easy to be removed once they have attached to the surface of the insulating film. Consequently, if the bumps grow under a condition in which the air bubbles have been attached to the surface of the insulating film, some bumps in the vicinity of air bubbles will grow but will avoid air bubbles, hence causing defects such as deformed bumps.

In order to reduce ungrown bumps or improperly grown bumps and to reduce defects such as deformed bumps, there has been suggested an improved method which will be described in the following. Namely, before being dipped into a plating liquid, the laminated body 4 is at first dipped into a solvent (such as methanol) having a good wetability with respect to the insulating film. In this way, bump holes are at first filled with the solvent which is then replaced by the plating liquid.

However, although the use of the above method makes it possible to reduce the number of ungrown bumps or improperly grown bumps, it is still difficult to completely eliminate the above-described defective bumps. Another problem associated with the above method is that it involves a complex manufacturing process and hence production cost is high.

In order to solve the above problem, Japanese Unexamined Patent Application Publication No. 8-180757 has disclosed another technique requiring that the bump holes be subjected to an ozone treatment and/or an ultraviolet light treatment. However, the ozone treatment and/or ultraviolet light treatment have been found to provide only a weak effect but require a considerably long treatment time. For example, when a laser beam is used to form holes through the insulating layer (made of polyimide or the like), carbons generated due to laser ablation as well as the insulating layer itself will be melted and burned (carbonized). As a result, carbons such as "soot" and "dregs" (decomposition products of the insulating layer, mainly containing black carbon) will easily get into and attach around the bump holes. At this time, even if the ozone treatment and/or ultraviolet light treatment are conducted continuously for 30 minutes, it is still almost impossible to remove the carbons such as "soot" and "dregs".

On the other hand, with regard to the contact holes formed in the multi-layered wiring substrate, some organic substances such as a residue of the insulating layer and a residue of a development liquid will remain within the contact holes, causing a decrease in the reliability of an electric connection formed through the con tact holes. Consequently, the multi-layered wiring substrate has only a deteriorated yield.

In particular, with regard to the contact element and the multi-layered wiring substrate (both of which together form part of the wafer batch contact board), since each product involves a large number of holes, the above-described problems will reduce the yield of each product and increase the cost for manufacturing each product. Accordingly, there has been a strong demand to develop a new technique to solve the above problems.

SUMMARY OF THE INVENTION

It is a first object of the present invention to provide an improved method of manufacturing a contact element, which method is capable of completing a predetermined treatment within a shortened time and ensuring an increased treatment effect as compared with the ozone treatment and/or ultraviolet light irradiating treatment, in particular, capable of exactly eliminating in a short time carbons such as "soot" and "dregs" generated and attached due to laser light irradiation. Therefore, when the bumps are subjected to plating treatment during the contact element manufacturing process, it is possible to exactly eliminate some defects such as deformed bumps caused due to the presence of the above-described carbons.

It is a second object of the present invention to provide a method of manufacturing a multi-layered wiring substrate having a high electric connection reliability obtainable through contact holes formed in the wiring substrate, thus enabling the multi-layered wiring substrate to have a high yield.

It is a third object of the present invention to provide a wafer batch contact board which has a high reliability and a high yield and can be produced at a low cost.

In order to achieve the above objects, the present invention has been accomplished as having the following constitutions.

According to a first aspect of the present invention, there is provided a method for manufacturing a contact element, comprising the steps of: forming a laminated body including an insulating film and at least one electrically conductive layer; forming, in the predetermined positions of the insulating film, bump holes extending from the surface of the insulating film to the at least one electrically conductive layer; performing surface treatment by carrying out a plasma treatment to treat the interior of the bump holes and/or the surface of the insulating film; and forming bumps on the bump holes treated in the surface treatment step.

According to a second aspect of the present invention, there is a method for manufacturing a contact element, comprising the steps of: forming a laminated body including an insulating film and at least one electrically conductive layer; forming, in the predetermined positions of the insulating film, bump holes extending from the surface of the insulating film to the at least one electrically conductive layer; performing surface treatment by carrying out an X-ray irradiation to treat the interior of the bump holes and/or the surface of the insulating film; and forming bumps on the bump holes treated in the surface treatment step.

According to a third aspect of the present invention, there is provided a method for manufacturing a contact element, wherein the bump holes are formed through a laser treatment.

According to a fourth aspect of the present invention, there is provided a method for manufacturing a contact element, wherein after the surface treatment performed by carrying out the plasma treatment and/or the X-ray irradiation to treat the interior of the bump holes and/or the surface of the insulating film, an oxide film removal treatment is carried out prior to an electrolytic plating or a non-electrolytic plating, for removing an oxide film of an electrically conductive layer exposed to the bottoms of the bump holes, followed by forming bumps on the bump holes through the electrolytic plating, with the electrically conductive layers serving as an electrode.

According to a fifth aspect of the present invention, there is provided a method for manufacturing a contact element, comprising a step of spreading the laminated body over a support frame.

According to a sixth aspect of the present invention, there is provided a method for manufacturing a multi-layered wiring substrate which is formed by at first laminating, on an insulating substrate material, a plurality of electrically conductive layers with an insulating layer interposed therebetween, then conducting the electrically conductive layers through a plurality of contact holes formed in the insulating layer, the method comprising a surface treatment which is effected by carrying out a plasma treatment to treat the interior of the contact holes and/or the surface of the insulating layer, in an atmosphere of a mixed gas formed by an oxygen gas and another containing halogen atoms in its molecules.

According to a seventh aspect of the present invention, there is provided a method for manufacturing a multi-layered wiring substrate which is formed by at first laminating, on an insulating substrate material, a plurality of electrically conductive layers with an insulating layer interposed therebetween, then conducting the electrically conductive layers through a plurality of contact holes formed in the insulating layer, the method comprising a surface treatment which is effected by carrying out an X-ray irradiation to treat the interior of the contact holes and/or the surface of the insulating layer.

According to an eighth aspect of the present invention, there is provided a method for manufacturing a multi-layered wiring substrate forming part of a wafer batch contact board which is for use in the batch examining of numerous semiconductor devices formed on a wafer, the method comprising the steps of: forming a first electrically conductive layer on an insulating substrate, patterning the first electrically conductive layer to form a first wiring pattern; forming an insulating layer on the first wiring pattern and forming contact holes in the insulating layer; performing a surface treatment which is effected by carrying out the plasma treatment or the X-ray irradiation to treat the interior of the contact holes and/or the surface of the insulating layer; and forming a second electrically conductive layer on an insulating substrate, patterning the second electrically conductive layer to form a second wiring pattern. In particular, a series of processes including the step of forming the insulating film and the contact holes, the step of performing the surface treatment and the step of forming the second wiring pattern are repeated at least once.

According to a ninth aspect of the present invention, there is provided a wafer batch contact board comprising: a contact element for use in a wafer batch contact board which is produced according to the method of the fifth aspect of the invention; and a multi-layered wiring substrate for use in a wafer batch contact board which is produced according to the method of the eighth aspect of the invention; and an anisotropic electrically conductive rubber for electrically connecting the multi-layered wiring substrate with the contact element.

According to the first and second aspects of the present invention, the use of the plasma treatment and/or X-ray (soft X-ray) irradiation is effective for removing in a short time the organic substances existing on the surface of the insulating film and/or within the bump holes. An effect obtained from such a treatment is highly acceptable.

Furthermore, using the plasma treatment and/or X-ray (soft X-ray) irradiation makes it possible to modify the surface of the insulating film and/or the internal surface of the bump holes. Therefore, it can be made exact for the plating liquid to more easily wet the surface of the insulating film and/or the internal surface of the bump holes. As a result, it becomes possible to greatly reduce ungrown bumps which will otherwise be caused due to incomplete filling of the bump holes with the plating liquid, as well as insufficient growth of bumps which will otherwise be caused due to insufficient filling of the bump holes with the plating liquid. Further, it is also possible to greatly reduce the defective contact points such as deformed bumps which will otherwise be caused due to a fact that during the plating treatment, air bubbles will adhere to the surface of the insulating resin layer adjacent to the bump holes.

Moreover, since the plasma treatment makes it possible to properly make rough the plated surface, it is possible for the plating liquid to more easily wet the plated surface.

Since the above effect has been proved to have a higher energy than an ultraviolet-ozone treatment using an ultraviolet-ozone treatment apparatus, a necessary time for carrying out the treatment of the present invention is allowed to be shortened to a great extent, thus improving the manufacturing efficiency.

According to the third aspect of the present invention, it is allowed to obtain the following effect. That is, when laser is used to perform laser treatment to form holes in the insulating film, although carbons will be generated during laser ablation and the insulating film will be melted and burned (carbonized) due to a heat and thus carbons such as "soot" and "dregs" will occur and adhere to the internal surface of the bump holes and around the openings of these bump holes. However, such "soot" and "dregs" can be completely removed in a short time by using the plasma treatment and/or X-ray (soft X-ray) irradiation of the present invention. As a result, during the step of bump plating for manufacturing the contact element, it can be made exact to prevent any defects such as deformed bumps which will otherwise be caused due to the above carbons. In this way, since the organic substances such as the above carbons may be completely removed, the wettability of the plating liquid can be improved when the above material is being wetted by the plating liquid and air bubbles can be prevented from occurring, thereby effecting an appropriate plating of the internal surface of the bump holes, as well as the desired formation of properly grown bumps. For this reason, the present invention is particularly useful for the case where a laser is used to perform a laser treatment to form holes in the insulating film.

According to the fourth aspect of the present invention, since an oxide film removal treatment is carried out, prior to an electrolytic plating, for removing an oxide film of an electrically conductive layer exposed to the bottoms of the bump holes, it can be made sure to prevent a conduction failure which will otherwise be caused due to an oxide film formed on the exposed surface of the electrically conductive layer. Further, it is also possible to avoid the occurrence of some ungrown bumps or improperly grown bumps.

According to the forth aspect of the present invention, since an oxide film removal treatment is carried out, prior to an electrolytic plating, for removing an oxide film of an electrically conductive layer exposed to the bottoms of the bump holes, it can be made sure to prevent a conduction failure which will otherwise be caused due to an oxide film formed on the exposed surface of the electrically conductive layer. Further, it is also possible to avoid the occurrence of some ungrown bumps or improperly grown bumps.

According to the fifth aspect of the present invention, since, the plasma treatment and/or the X-ray irradiation is performed under a condition where the laminated body is spread over a support frame, the laminated body will not warp or deflect, thereby making it possible to perform a uniform plasma treatment and/or the X-ray irradiation with respect to all the bump holes.

Moreover, since the positions of the bump holes will not be disturbed by a thermal expansion of the laminated body, it is allowed to produce a contact element having a high positional precision. In addition, since the bumps would have no positional deviations even if the contact element having a support frame will suffer from a thermal expansion, such a contact element can be suitably used to form a wafer batch contact board.

According to the sixth aspect of the present invention, since the plasma treatment is performed in an atmosphere of a mixed gas formed by an oxygen gas and another gas whose molecules contain halogen atoms, it is possible to inhibit an undesired etching of the insulating layer, also to inhibit an undesired build-up of some reaction products caused due to polymerization reaction.

Furthermore, since the plasma treatment can properly make rough the treated surface, the treated surface will have an improved combinability with an electrically conductive layer (it is allowed to expect an anchor effect).

However, operating conditions for the above treatment are allowed to be set in view of a real need, so that they may either be the same as or different from those for manufacturing the contact element.

According to the seventh aspect of the present invention, since an X-ray (soft X-ray) irradiation is carried out to treat the interior of the contact holes and/or the surface of the insulating layer, organic substances can be exactly removed, thereby making it possible to avoid a conduction failure caused due to contact holes, as well as an adhesion failure between an electrically conductive layer and the insulating layer.

Furthermore, since the X-ray (soft X-ray) irradiation can properly make rough the treated surface, the treated surface will have an improved combinability with an electrically conductive layer (it is allowed to expect an anchor effect).

However, operating conditions for the above treatment are allowed to be set in view of a real need, so that they may either be the same as or different from those for manufacturing the contact element.

According to the eighth aspect of the present invention, it is possible to obtain a multi-layered wiring substrate for use in a wafer batch contact board which has a high reliability as well as a high yield.

According to the ninth aspect of the present invention, since it is allowed to use a contact element and a multi-layered wiring substrate all having a high reliability as well as a high yield, it is possible to produce a wafer batch contact board which has a high reliability as well as a high yield, but can be manufactured at a low cost.

BRIEF DESCRIPTION OF THE DRAWINGS

FIGS. 4A to 4C are sectional views showing an intermediate product formation process in which a laminated body obtained in one example of the present invention has been spread over a support frame.

DESCRIPTION OF THE PREFERRED EMBODIMENTS

Figure 1:
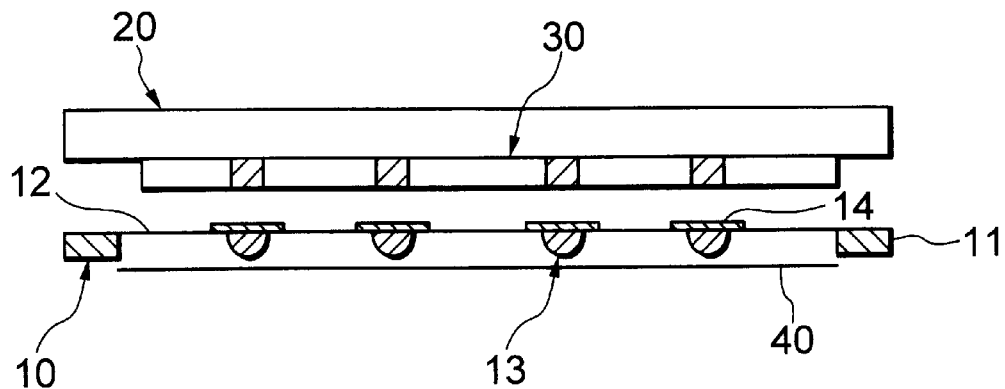
FIG. 1 is a view showing a conventional wafer batch contact board.

The present invention will be described in detail below.

In the present invention, plasma means a state in which ions, electrons and neutral molecules (atoms) are mixed together, with the whole system being maintained under a neutral condition. In the plasma, due to bombardment among the above particles, free radicals and excited molecules (atoms) and the like are mixed together, presenting a chemically active state. For example, once $CF_4$ is added to $O_2$, radicals such as ".O", ".F" and ".$CF_3$" will occur. Further, if $O_2$ is converted into a plasma, a state will occur in which ".$O_2$", ".O", "$O_2$+" and "e−" have been mixed together. Moreover, in a plasma where an electric discharge occurs in a rarefied gas, the temperature of the gas is lower than that of the electrons. This is called a low temperature plasma. In the low temperature plasma, although the gas is in a low temperature state, it is still possible to produce an active plasma containing active substances such as radicals, ions, excited molecules, thereby facilitating an effective treatment.

According to the present invention, it is preferred that the plasma treatment be conducted in an oxygen gas or an atmosphere containing the oxygen gas. In particular, it is preferred that the plasma treatment be conducted in a mixed gas atmosphere including an oxygen gas and another gas containing halogen atoms such as fluorine atoms in its molecules. In this way, upon the addition of a gas containing halogen atoms in its molecules, it is possible to prohibit the etching of the insulating layer, thereby inhibiting the build-up of reaction products generated in the polymerization.

Here, as a gas whose molecules contain fluorine atoms, it is allowed to use one or more of the flowing substances including fluorine gas ($F_2$), carbon tetrafluoride ($CF_4$), trifluoro methane ($CHF_3$), difluoromethane ($CH_2F_2$), monofluoro methane ($CH_3F$), ethane hexafluoride ($C_2F_6$), tetrafluoro ethane ($C_2H_2F_4$), sulfur hexafluoride ($SF_6$), and $NF_3$. Further, with regard to a gas whose molecules contain fluorine atoms, it is preferred that the fluorine atoms be present as many as possible, while the carbon atoms be as less as possible. On the other hand, although it is allowed to use a gas whose fluorine atoms have been partially or completely replaced by a halogen element (for example, Cl), it is still preferred to use a gas containing fluorine atoms, since fluorine atoms are more active in their chemical property than chlorine atoms. Among them, it is preferred to use $CF_4$ since it can provide a high vapor pressure and is easy to vaporize.

An amount of $CF_4$ contained in a mixed gas of $O_2/CF_4$ is preferred to be 0.1 to 50 vol %, more preferably 1 to 20 vol %. Most preferably, such an amount should be in the vicinity of 5 to 20 vol %. With regard to a contact element, a gas such as $CF_4$ whose molecules contain fluorine atoms is used to prevent the formation of carbons and other organic substances possibly occurred when using a laser treatment to form bump holes. On the other hand, with regard to a multi-layered wiring substrate, a gas such as $CF_4$ whose molecules contain fluorine atoms is used to prevent the formation of reaction products (such as organic polymers) during a process in which the residues remaining in the contact holes are ashed by virtue of $O_2$ contained in the mixed gas. Accordingly, if $CF_4$ content is less than 0.1 vol %, it will be difficult to ensure a sufficient effect of preventing the formation of the undesired reaction products. On the other hand, if $CF_4$ content exceeds 50 vol %, it will be difficult to ensure a desired ashing effect using $O_2$, hence requiring an prolonged treatment time. Here, as a buffer gas, it is allowed to use Ar, He and Ne.

In the present invention, the gas pressure is preferred to be controlled within a range of 0.1 to 0.45 Torr, preferably, a range 0.1 to 0.4 Torr. Most preferably, such a gas pressure should be controlled within a range of 0.2 to 0.3 Torr in order to maximize an etching speed.

When the gas pressure is less than 0.1 Torr, an RIE (Reactive Ion Etching) effect and a sputter etching effect will become too remarkable, hence bringing about a damage to the insulating film of a contact element and a damage to an insulating substrate material of the multi-layered wiring substrate. On the other hand, if the gas pressure is over 0.45 Torr, an electric discharge of the plasma will become unstable. As a result, it is not possible to uniformly remove the residues remaining within and around the bump holes formed in the contact element, nor is it allowed to uniformly remove the residues remaining within the contact holes formed in the multi-layered wiring substrate.

As apparatus suitable for carrying out the plasma treatment, it is allowed to use a parallel plane-table type plasma etching apparatus and a cylindrical type plasma etching apparatus. However, it is preferred to use the parallel plane-table type plasma etching apparatus since it is capable of carrying out a uniform plasma treatment.

On the other hand, although it is possible to select an industrial high frequency within a range of 10 kHz to 100 MHz, a practically useful frequency for industry is 13.56 MHz. However, the etching velocity is proportional to an output of a high frequency.

A time period for plasma treatment is set to be equal to or longer than a time necessary to completely remove carbons or the like occurred due to laser irradiation, but should be controlled within a range not bringing about any damage to the edge portions of contact holes and insulating layer.

When compared with the above described ultraviolet treatment and/or ozone treatment, the surface treatment using the plasma treatment method according to the present invention, can be carried out at a high speed due to its high energy, thereby making it possible to increase the manufacturing efficiency. Further, since the method of the present invention provides an extremely high effect in removing carbons such as "soot" and "dregs" occurred due to laser irradiation and attached to the insulating layer, a necessary time for removing the carbons is allowed to be shortened considerably.

Furthermore, according to the present invention, X-ray irradiation is a soft X-ray irradiation. This is because soft X-ray has a weak permeability, brings about less unfavorable effect on human body than X-ray. Therefore, soft X-ray is easier to handle than X-ray. However, the wavelength of X-ray is 10.2 to several hundred angstroms, and the wavelength of soft X-ray is several angstroms to several hundred angstroms.

Here, as the source of soft X-ray, it is allowed to use a braking radiation type source in which a metal such as Pd (4.4 Å), Si (7.1 Å) or the like is excited by an electron ray. Also, it is allowed to use a re-combination type source employing a rare gas discharge plasma (Ne: 9 to 14 Å, Kr: 6 to 8 Å) or a laser generating plasma (SuS: 8 to 22 Å). In addition, it is allowed to use a storage ring type source employing a synchrotron optical radiation (SOR).

When compared with the conventional treatment using an ultraviolet irradiation, the surface treatment using X-ray (soft X-ray) according to the present invention can effect a desired treatment at an increased speed owing to a higher energy, thereby ensuring an improved manufacturing efficiency.

With regard to the contact element made according to the present invention, the insulating film (sheet) should not be limited to any particular material, provided that it has a desired electrically insulating property. However, it is preferred to use a material having not only an electrically insulating property but also a flexibility. In detail, it is allowed to use a thermosetting resin or a thermoplastic resin, such as a polyimide resin, a polyester resin, an epoxy resin, an urethane resin, a polystyrene resin, a polyethylene resin, a polyamide resin, an ABS copolymer resin, a polycarbonate resin, a silicon resin and a fluorine resin. In fact, the above listed resins may be selected in accordance with a real need. Since a polyimide resin has an excellent heat resistance and an excellent chemical resistance as well as an excellent mechanical strength and an excellent workability, it is preferred to use the polyimide resin. Further, since the polyimide resin is capable of absorbing a large amount of ultraviolet light, it is suitable to be processed by a laser ablation. Moreover, since the polyimide film has a high flexibility, it can exactly absorb some irregularities of bumps formed on a contact element and some irregularities of contact points (pads) formed on an examined object.

Although the thickness of the polyimide film may be selected optionally in accordance with a real need, in order to ensure an easy formation of the bump holes, such thickness is preferred to be controlled within a range of 5 to 200 µm, preferably 10 to 50 µm.

As a method of forming the bump holes, it is allowed to perform a laser treatment, a lithography treatment (including etching treatment), a plasma treatment, a light treatment or a mechanical treatment. However, in order to ensure a fine processing capability, a freedom of forming various shapes, as well as a high processing precision, it is preferred to use the laser treatment.

When the laser treatment is selected, it is preferred to use an excimer laser, $CO_2$ laser or YAG laser, all of which are able to provide a large irradiation output. If a laser ablation involving the use of an excimer laser is employed, it is possible to inhibit the melting of the polyimide film (the melting is usually caused due to a heat), obtain a high aspect ratio, thereby permitting the formation of fine holes with a high precision. Thus, when the laser treatment is carried out, a laser beam converged at a spot is caused to irradiate the surface of the polyimide film, thereby forming a plurality of bump holes.

In some other cases, a resist pattern may be used as a mask and bump holes may be formed by conducting a plasma etching treatment in an atmosphere containing oxygen and fluoride gas, a dry etching treatment such as RIE (Reactive Ion Etching) or a sputter etching treatment.

Furthermore, if a mask formed with a plurality of through holes (circular, square or rhomb) is tightly attached to one side (on which an electrically conductive layer is not laminated) of the polyimide film, and an etching treatment is then conducted from a position above of the mask, it is still possible to form the desired bump holes.

The diameter of the bump holes is usually within a range of 5 to 200 µm, preferably 20 to 50 µm. In the case where the bumps are formed corresponding to a solder ball, the diameter of the bump holes may be made equal to the diameter of the solder ball (300 to 1000 µm).

The electrically conductive layer may be made from any optional material, provided that it has an electric conductivity. For example, it is allowed to use a single metal, such as copper, nickel, aluminum, gold, platinum, silver, lead, tin, indium, rhodium, tungsten, ruthenium or iron. It is also allowed to use various alloys containing the above metals, such as solder, nickel-tin, gold-cobalt. If the bumps and the like are formed in an electrolytic plating process, an electrically conductive layer may be selected which forms an electrode (cathode). Here, the electrically conductive layer may be a single layer consisting of one or more of the above metals, or may be a laminated structure. For example, Cr or Ni film serving as a base coat, Cu film, Ni film and Au film are laminated successively on the insulating film. At this time, since a Cr film serving as a base coat has a good adhesion with the insulating film such as polyimide film, it is preferred to use the Cr film as a base coat. Further, since a Ni film serving as a base coat also has a good adhesion with the insulating film such as polyimide film, it is also preferred to use the Ni film as a base coat. Here, Cu film serves as a main portion of the electrically conductive layer. Ni film serves as an intermediate layer for the formation of an Au layer on the outmost surface of the electrically conductive layer. Ni film also serves to increase the mechanical strength of the electrically conductive layer. In practice, Au film is formed to prevent the oxidation of the surface of the electrically conductive layer, also to reduce a contact resistance. However, instead of Au film, it is also possible to use a gold-cobalt alloy, rhodium and palladium. Specifically, using the gold-cobalt alloy is effective for improving the mechanical strength of pads.

As a method for forming the electrically conductive metal layer, it is permitted to carry out a sputtering process, vapor deposition, non-electrolytic plating, or electrolytic plating.

Since Ni film and Au film to be formed on Cu film are each required to have a sufficient mechanical strength, and to have a relatively thick plating film, it is preferred to use a plating treatment (non-electrolytic plating or electrolytic plating). On the other hand, formation of such film may be also realized by a combination of both the sputtering treatment and plating treatment. For example, a thin film is deposited at first by the sputtering treatment and, thereafter, a thick film is formed on the thin film by the plating.

The thickness of the electrically conductive layer should not be limited, but may be selected optionally.

According to the present invention, by patterning an electrically conductive layer formed over the entire surface of the insulating film, it is possible to form isolated electrodes (pads and the like) and wiring pattern on the insulating film. For example, after a resist pattern is formed on the electrically conductive film formed in advance on the insulating film, exposed portions of the electrically conductive layer are etched into desired isolated electrodes or wiring pattern. Although the formation of the wiring pattern on the insulating film might decrease flexibility, the isolated electrodes formed on the insulating film do not adversely affect the flexibility.

Furthermore, the isolated electrodes or wiring pattern may also be directly formed on the insulating film. For example, a mask is used to cover the portions on which the isolated electrodes or wiring pattern are not formed. Then, a film formation method, such as sputtering, vapor deposition and plating treatment is conducted. As a result, the isolated electrodes or wiring patterns are directly formed on non-masked portions. Further, the isolated electrodes or wiring patterns may also be directly drawn and formed by using a dispenser or by using a printing method. At this time, bumps may be formed by electrolytic plating by using the isolated electrodes or wiring patterns as conductive layers (electrodes).

As a method for forming the bumps, it is allowed to use electrolytic (electric) plating, non-electrolytic plating, and CVD method. However, it is preferred to use an electrolytic plating method, since this method can ensure the formation of bumps whose shapes can be easily controlled and has an improved precision.

Figure 2A:
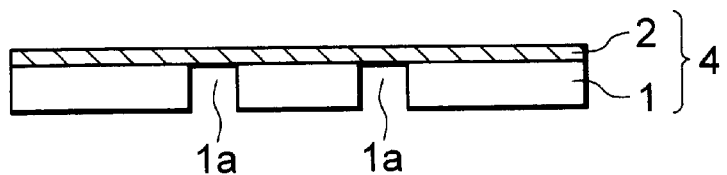
FIG. 2A and FIG. 2B are partially sectional views showing the structure of a contact element which forms part of the wafer batch contact board illustrated in FIG. 1, also showing a method for manufacturing the same.
Figure 2B:
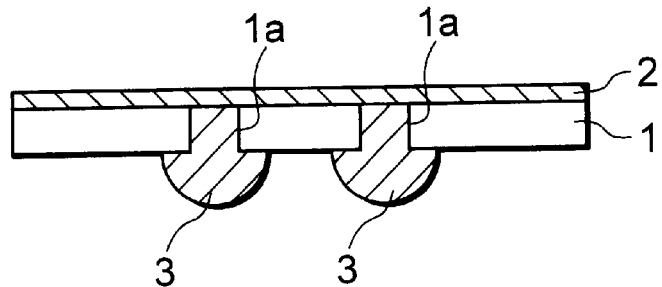

The materials for forming the bumps (plating liquid material) should not be limited, provided that they are metals having a desired electric conductivity. In fact, it is allowed to use the same materials as those for forming the above electrically conductive layer. Although in the present invention it is allowed to perform a plating treatment using various metals, it is preferred to use Ni, Au, Ag, Cu, Sn, Co, In, Rh, Cr, W or Ru. Alternatively, it is preferred to use an alloy mainly containing one or more of these metals. In electrolytic plating, as shown in FIG. 2A, an electrically conductive layer 2 is connected to an electrode, a laminated body 4 is dipped in a plating bath so that the electrically conductive layer 2 can serve as a cathode, thereby allowing the conduction of an electricity. At this time, the density of an electric current is set to a predetermined value, but it should be different depending on the sort of a plating metal. For example, if nickel is used as a plating material, the current density is set within a range of 0.1 to 60 A/dm$^2$. With the flowing of the current, at least the bump holes 1a of the insulating film 1 are filled by metallic substances, thereby forming the bumps.

If necessary, various metal films may be formed on the surfaces of the bumps. For example, if it is desired to improve the hardness of the bump surfaces, and if it is required to prevent the contamination of the bumps (caused due to migration in a burn-in test), it is allowed to cover the surfaces of the bumps with a metal layer formed of Au, Au—Co, Rh, Pt, Pd or Ag, or a metal layer formed of an alloy mainly containing two or more of the above metal elements. In practice, the covering metal layer may be either a single layered structure or a multi-layered structure.

In the present invention, the bumps serve as contact points (contact portions) which are provided on the surface of the insulating film to effect a desired electric contact and a desired electric connection. The state of all the contact points can be maintained irrespective of whether or not there are projections formed on the surface of the insulating film. Further, the shape of the bumps may be convex, flat or concave, corresponding to the shape of elements which are prepared to get in contact with the bumps. In practice, the three-dimensional shape of the bumps should not be limited to any particular configuration, but may be formed into any desired solid shape. However, it is preferred that the bumps are formed into mushroom shape, since this shape can offer a high reliability in electric connection. The height and size of the bumps may be designed freely in accordance with a real need in use.

However, during the electrolytic plating, it is usual that a protection film is formed to protect the surface of the electrically conductive layer. In order to form the protection layer, it is necessary to have a drying step to dry the protection layer. As a result, exposed surface of the electrically conductive layer on the bottom of each bump hole is oxidized, and thus an undesired oxide film is formed. Since the formation of the oxide film on the exposed surface of the electrically conductive layer will cause a deterioration to occur in electric conductivity, there will occur ungrown bumps or improperly grown bumps. For this reason, it is necessary to perform a pretreatment immediately before the plating so as to remove the oxide film. In the case where the pretreatment is conducted, a pretreatment agent for removing the oxide film should not be limited, provided that it is capable of removing the oxide film. For example, it is allowed to use a soft etching agent containing a dilute sulfuric acid, if the soft etching agent is capable of removing a copper oxide. During the process of removing the oxide film, if the laminated body is dipped in the treatment liquid for 1 to 3 minutes, it is possible to activate the exposed surface of the electrically conductive layer on the bottom of each bump hole. Here, the protection film formed for protecting the electrically conductive layer is finally removed as an unwanted layer from the electrically conductive layer.

Next, the multi-layered wiring substrate of the present invention will be described.

The multi-layered wiring substrate of the present invention comprises an insulating layer (an insulating film) which is preferred to be formed by a resin material, such as acryl resin, epoxy resin, polyimide resin and the like. Specifically, it is preferred to use a polyimide resin which has a low coefficient of thermal expansion, also has an excellent heat resistance and an excellent chemical resistance.

In practice, the insulating layer may be formed on a glass substrate or a wiring layer by virtue of spin coating, roll coating, curtain coating or spray coating, or by virtue of a printing treatment.

Here, the wiring layer may be formed in the following way. That is, an electrically conductive thin film is formed on the glass substrate or the insulating film by using a film formation method such as sputterring. Then, a photolithography process (including resist application, exposure, development and etching) is carried out, thereby forming a desired wiring pattern.

Although there is not any limitation to the wiring material and wiring structure of the wiring layer, it is preferred to use a multi-layered structure of Cr/Cu/Ni laminated from below, a multi-layered structure of Cu/Ni/Au laminated from below, or a multi-layered structure of Cr/Cu/Ni/Au laminated from below, all with Cu serving as a main wiring material.

Here, Cr and Ni can be used to prevent the oxidation of Cu which is likely to be oxidized (in particular, the use of Ni can ensure an improved corrosion resistance). Further, since Cr and Ni have a good adhesion with Cu and other adjacent layers (for example, Ni has a good adhesion with Au layer, Cr has a good adhesion with the glass substrate and the insulating layer), it is possible to maintain an improved adhesion among various layers.

As some substitutes for replacing Cu serving as a main wiring material, it is allowed to use Al, Mo or the like. Here, the thickness of Cu serving as a main wiring material is in a range of 0.5 to 15 $\mu$m, preferably 1.0 to 7.0 $\mu$m, more preferably 2.5 to 6 $\mu$m.

As some substitutes for replacing Cr serving as a base coat, it is allowed to use W, Ti, Al, Mo, Ta or CrSi.

As some substitutes for replacing Ni, it is allowed to use metal materials having a high adhesion with both the upper and lower layers.

As some substitutes for replacing Au, it is allowed to use Ag, Pt, Ir, Os, Pd, Rh or Ru.

In the multi-layered wiring substrate, the wiring surface of the upmost layer (the outermost surface) is coated with gold or the like, in order to prevent the oxidation of the wiring surface and to protect the same, as well as to reduce a contact resistance. However, it is not necessary to coat the surface of the lower layer with gold or the like. On the other hand, in order to ensure a reduced contact resistance, the wiring layer of inner layers may be further coated with gold. This, however, could cause an increase in product cost, but will not bring about any other problems.

The coating of the wiring surface with gold or the like may be performed at a later step. But, it is also allowed to in advance form a multi-layered wiring layer whose outermost surface has been entirely coated with gold or the like. Then, various layers of the multi-layered wiring layer are subjected to wet-etching, thereby forming a desired wiring pattern. In addition, it is also possible that after the formation of the contact holes, merely the bottom (part of the wiring surface of an inner layer) of each contact hole is coated with gold or the like.

In forming a wiring layer having a multi-layered structure of Cr/Cu/Ni laminated from below, Cr and Cu layers may be formed by sputterring, Ni layer may be formed by electrolytic plating. In particular, since the electrolytic plating permits the formation of Ni layer having a relatively large thickness, it is possible to reduce the production cost. Further, since the surface of Ni layer is relatively rough, another film can be formed on the Ni layer. However, when an Au film is to be formed on the Ni layer, it is preferred to perform a continuous plating treatment so as to prevent the oxidation of the Ni layer.

Furthermore, the multi-layered wiring substrate may be such that a multi-layered wiring structure is formed on one side of the insulating substrate, or that both sides of the insulating layer are provided with multi-layered wiring structures.

As an insulating substrate for use in the multi-layered wiring substrate of the present invention, it is preferred to use a glass substrate, a ceramic substrate (SiC, SiN, or alumina), a glass ceramic substrate or a silicon substrate. The thermal expansion coefficient of the insulating substrate is preferred to be 10 ppm/° C. or lower.

However, among the various substrates listed in the above, it is preferred to use a glass substrate because of the following reasons. That is, as compared with a ceramic substrate, a glass substrate is cheap in its price, easy to process, easy to obtain a desired flatness through a high precision polishing. Further, since a glass substrate is transparent, it is easy to effect an alignment among various layers. Moreover, the thermal expansion of a glass substrate may be controlled by selecting appropriate glass material. Usually, a glass substrate has an excellent electric insulating property. In addition, a warpage is not likely to occur in a glass substrate even if there is a stress exerted thereon. Furthermore, a glass substrate is easier to be shaped into any desired configuration than substrates made of other materials. Finally, if a glass substrate is made from a non-alkali glass, it is sure to prevent an alkali component from eluting to the surface of the glass substrate.

As a glass substrate having a thermal expansion coefficient of 10 ppm/° C. or lower, there may be the following composition.

$SiO_2$: 1 to 85 wt %, $Al_2O_3$: 0 to 40 wt %, $B_2O_3$: 0 to 50 wt %, RO: 0 to 50 wt % (however, R is an alkali earth metal element; Mg, Ca, Sr or Ba), R'O: 0 to 20 wt % (however, R' is an alkali earth metal element; Li, Na, K, Rb or Cs), other components: 0 to 5 wt % (for example, $As_2O_3$, $Sb_2O_3$, ZrO, ZnO, $P_2O_5$, $La_2O_3$, PbO, F and Cl).

EXAMPLES

The present invention will be described in detail below with reference to Examples and Comparative Examples. However, the present invention is by no means to be limited to these Examples.

Example 1

Preparation of Contact Element

An electrically conductive layer (copper layer) (18 μm) consisting of copper foil was formed on one side of a polyimide film (25 μm) serving as an insulating film, thereby forming a two-layer structure which is a laminated body. Then, KrF excimer laser light having a wavelength of 248 nm was used to irradiate the surface of the polyimide film through a mask. Thus, 10000 fine bump holes each having a diameter of 25 μm were formed only in polyimide film.

At this time, polyimide decomposition products having a black color were found to have adhered to the bottoms of the bump holes and in the vicinity of their openings. The decomposition products mainly contained carbons and could serve as electric conductors during a plating process. Accordingly, in the case where bumps are formed by means of electrolytic plating, if these decomposition products are not removed completely, they will directly hamper the formation of bumps having predetermined shape. In general, as a method for removing the decomposition products, there has been known a process using potassium permanganate. However, this method is not suitable for use in the case where the bump holes are quite small (such as in the present example) because the treatment agent is difficult to flow to the bottoms of the bump holes. As a result, using such a known method is difficult to completely remove the decomposition products adhered to the bump holes.

In contrast, when using the plasma treatment according to the present invention, it was found that this treatment was able to completely remove the "soot" and "dregs" which were polyimide decomposition products (mainly containing carbons) occurred due to laser treatment and adhered in and around the bump holes.

However, the conditions for the plasma treatment in the present example are as follows.

Atmosphere gas (molar ratio): $O_2$: $CF_4$=9:1
($CF_4$ content of the mixed gas: 10 vol %)
Gas pressure: 0.25 Torr=33.3 Pa (1 Torr=133.3 Pa)
High frequency output: 0.5 W/cm$^2$
Substrate temperature: substrate stage was cooled by a cooling water to 20° C.
Plasma treating time: 30 seconds
Apparatus: parallel plane table type plasma treating apparatus The state of bump holes after plasma treatment were found to be as follows.

The diameter of openings of bump holes (adjacent to the surface of the polyimide film) was 30 μm, while the diameter of bottoms of bump holes (adjacent to the interface between the polyimide film and the copper layer) was 26 μm φ, the depth of bump holes was 25 μm.

Afterwards, bisphenol type resist was applied to the surface of the copper layer of the two-layer structure, followed by hardening at a temperature of 90° C. for 30 seconds, thus forming a protection film over the copper layer.

Then, the two-layer structure was dipped in an ethanol solution, so that the bump holes were filled by the ethanol solution. Subsequently, the ethanol solution remaining within the bump holes were replaced by water. After this, the two-layer structure was dipped in an acid to remove oxide films, followed by performing a washing treatment using a pure water, thereby removing the remaining acid.

Next, the copper layer was connected to an electrode and was dipped in a nickel plating bath having a temperature of 60° C. Then, with the copper layer serving as a negative electrode, nickel plating is caused to grow within the bump holes. At this time, the current density was set at 3 A/dm$^2$, and the plating process was continued until the projections of plated nickel became 30 μm protruding from the surface of the polyimide film.

Finally, the resist layer formed on the copper layer was removed, thereby obtaining a contact element having nickel bumps. Upon observing all the bumps of the contact element with the use of a microscope, it was found that there was no bump lacking, nor was there any defective bumps.

Furthermore, tape stripping test (JISZ-0237) was conducted and the durability (adhesion force) of the bumps was examined, no bump was found to have been lacking.

Example 2

This example was carried out in the same manner as in Example 1 except that atmosphere gas (molar ratio) was $O_2$: $CF_4$=8:2 ($CF_4$ content of the mixed gas: 20 vol %), thereby producing the contact element.

As a result, it was found that the same effect as in Example 1 was obtained.

Example 3

This example was carried out in the same manner as in Example 1 except that the plasma treatment time was different, thereby producing a contact element.

The results of visual observation of remaining carbons after the plasma treatment, and the results of tape stripping test (the number of lacking bumps) are shown in Table 1.

TABLE 1

| Plasma Treatment Time (second) | 0 | 10 | 20 | 25 | 30 | 40 | 50 | 60 |
|---|---|---|---|---|---|---|---|---|
| Remaining carbon (visual observation) | x | x | Δ | ○ | ○ | ○ | ○ | burned *1 |
| Tape Stripping Test | 100 | 65 | 4 | 0 | 0 | 0 | 0 | 0 |

*1: partially burned (carbonized)

In Table 1, it is understood that once the plasma treatment time is over 40 seconds, defects (damages) having a white color will occur around the bump holes, hence hampering the growth of the plating. Further, if the plasma treatment time exceeds 50 seconds, the oxide film formed on the surface of the electrically conductive layer exposed to the bottoms of the bump holes will become large in their thickness. As a result, bumps will be found lacking during the tape stripping test. Moreover, if the plasma treatment time is over 60 seconds, polyimide film will be partially burned and carbonized. Accordingly, it is understood from the above that the plasma treatment time is preferred to be 25 to 50 seconds, more preferably 25 to 40 seconds.

Example 4

This example was carried out in the same manner as in Example 1 except that soft X-ray irradiation was conducted for 30 minutes prior to the bump plating process, thereby producing a contact element.

As a result, it was found that the same effect as in Example 1 was obtained.

Comparative Example 1

This comparative example was carried out in the same manner as in Example 1 except that plasma treatment before the bump plating process was omitted, thereby producing a contact element.

As a result, as shown in Table 1, this comparative example was not able to remove polyimide decomposition products ("soot", "dregs" and the like, mainly containing carbons) which occurred due to the laser treatment and adhered in and around the bump holes. In the tape stripping test, it was found that 100 bumps were lacking.

Comparative Example 2

This comparative example was carried out in the same manner as in Example 2 except that the soft X-ray irradiation before bump plating was omitted, thereby producing a contact element.

As a result, it was found that the same effect as in Comparative Example 1 was obtained.

Comparative Example 3

This comparative example was carried out in the same manner as in Example 1 except that an ultraviolet light-ozone treatment was conducted using an ultraviolet light-ozone treating apparatus, rather than using the plasma treatment, thereby producing contact a element.

As a result, it was found that although the ultraviolet light-ozone treatment was conducted for 30 minutes, this comparative example was not able to remove polyimide decomposition products ("soot", "dregs" and the like, mainly containing carbons) which occurred due to the laser treatment and adhered in and around the bump holes.

Examples 5 to 8, Comparative Examples 4 to 5

The examples and comparative examples were conducted in the same manner as in Example 1, except that gas pressure was set such that it was 0.05 Torr (Comparative Example 4), 0.1 Torr (Example 5), 0.2 Torr (Example 6), 0.3 Torr (Example 7), 0.4 Torr (Example 8), 0.5 Torr (Comparative Example 5), thereby producing contact elements. As a result, when the gas pressure was 0.05 Torr, the sputter etching produced an increased effect, while the insulating films of the contact elements received a considerably large damage. On the other hand, when the gas pressure was 0.5 Torr, plasma discharge became unstable. As a result, it was unable to uniformly remove the decomposition products remaining inside and around the bump holes formed in the contact elements.

| Gas Pressure (Torr) | 0.05 | 0.1 | 0.2 | 0.25 | 0.3 | 0.4 | 0.5 |
|---|---|---|---|---|---|---|---|
| Damage upon Insulating Film | x | ○ | ⊚~○ | ⊚ | ⊚~○ | ○ | — |
| Uniformity of Removal | x~Δ | ○~Δ | ⊚~○ | ⊚ | ⊚~○ | Δ | x |

Explanation of marks:
10 contact elements were prepared and observed using a microscope.

⊚: uniformity→acceptable product ratio: 10/10 (no damage at all)
○: uniformity→acceptable product ratio: 8–9/10
Δ: uniformity→acceptable product ratio: 6–7/10
X: uniformity→acceptable product ratio: ≦5/10
–: no discharge Here, "acceptable product" means that no residue was found in or around any bump holes.

It is understood that if the gas pressure is controlled within a range of 0.1 to 0.45 Torr, preferably 0.1 to 0.4 Torr, further preferably 0.2 to 0.3 Torr, it is allowed to minimize a damage to the insulating film and ensure a removal uniformity.

Examples 9 to 14, Comparative Examples 6 to 7

Based on the above Example 1, $CF_4$ content of the mixed gas was set at 0.05 vol % (Comparative Example 6), 0.1 vol % (Example 9), 0.5 vol % (Example 10), 1 vol % (Example 11), 5 vol % (Example 12), 30 vol % (Example 13), 50 vol % (Example 14), 70 vol % (Comparative Example 7). Other operations were the same as in Example 1, thereby obtaining contact elements. As a result, it was found that if the $CF_4$ content of the mixed gas is set at 0.05 vol %, it is difficult to obtain a sufficient effect of preventing the formation of undesired reaction products. Consequently, carbons occurred during the laser treatment will still be partly remaining. On the other hand, if the $CF_4$ content of the mixed gas is over 70 vol %, an ashing effect obtainable by $O_2$ will be reduced. For this reason, these $CF_4$ contents are not recommendable since a relatively long time is needed for complete removal of the carbons (in the following table, since the treatment time was only 30 seconds, carbons are still remaining on some contact elements).

| $CF_4$ content (vol %) | 0.05 | 0.1 | 0.5 | 1 | 5 | 10 | 20 | 30 | 50 | 70 |
|---|---|---|---|---|---|---|---|---|---|---|
| Residue | x | Δ | Δ | ○ | ⊚ | ⊚ | ○~⊚ | Δ | Δ | Δ~x |

Explanation of marks:
10 contact elements were prepared and observed using a microscope.

⊚: residue→acceptable product ratio: 10/10 (no residue at all)
○: residue→acceptable product ratio: 8–9/10
Δ: residue→acceptable product ratio: 6–7/10
X: residue→acceptable product ratio: ≦5/10

Here, "acceptable product" means that no residue was found in or around any bump holes.

It is understood from the above results that if the residue is to be removed as completely as possible within a possibly shortest time, $CF_4$ content of the mixed gas ($O_2$ +$CF_4$) should be controlled within a range of 0.1 to 50 vol %, preferably 1 to 20 vol %, more preferably 5 to 20 vol %.

However, in the above Examples 5 to 10 and Comparative Examples 4 to 7, it was confirmed that similar results were obtained even if the mixed gas contained other fluorines than $CF_4$. Further, it was confirmed that the above results could also be used to explain the phenomenon occurred in the contact holes and/or on the surface of the insulating layer in a multi-layered wiring substrate.

Example 11

In Example 11, a multi-layered wiring substrate (for use in a wafer batch contact board), a contact element (for use in a wafer batch contact board), and an anisotropic electrically conductive rubber were prepared and assembled together to form a wafer batch contact board.

Preparation of Multi-layered Wiring Substrate

FIGS. 3A to 3E are important portion sectional views showing an example of a process for manufacturing a multi-layered wiring substrate.

Figure 3A:
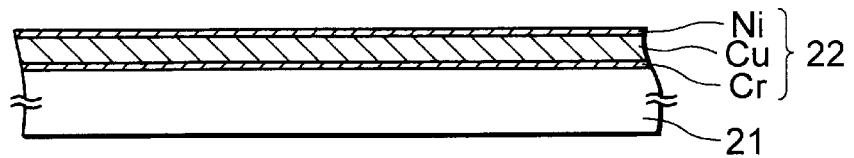
FIGS. 3A to 3E are sectional views showing a process for manufacturing a multi-layered wiring substrate for use in a wafer batch contact board, according to one example of the present invention.

As shown in FIG. 3A, one side of a glass substrate 21 (whose surface had been polished into flat, having a size of 320 mm on each side and having a thickness of 3 mm, and having a composition Of $SiO_2$: 60.0 mol %, $Al_2O_3$: 9.0 mol %, CaO: 9.4 mol %, MgO: 9.3 mol %, ZnO: 9.3 mol %, PbO: 3.0 mol %) was subjected to a sputtering treatment, so as to form thereon (successively) Cr film having a thickness of about 300 angstroms, Cu film having a thickness of about 2.5 $\mu$m, Ni film having a thickness of about 0.3 $\mu$m, thereby obtaining a Cr/Cu/Ni wiring layer 22.

Here, Cr film was provided for the purpose of increasing an adhesion between the glass and Cu film, Ni film was provided for the purpose of preventing the oxidation of Cu film. Further, the provision of Ni film is also for the purpose of increasing an adhesion between Cu film and a resist, and for the purpose of preventing polyimide from remaining on the bottoms of contact holes (vias) during a reaction between Cu and polyimide.

However, Ni film formation method should not be limited to the above sputtering treatment. In fact, it is also possible to form Ni film by using an electrolytic plating process. Further, it is also possible that Au film may be formed on Ni film by means of sputtering, electrolytic plating or non-electrolytic plating, thereby making it possible to reduce the contact resistance.

Figure 3B:
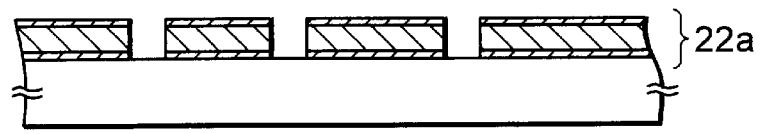

Then, as shown in FIG. 3B, a predetermined photolithography process (including exposure, development and etching) was conducted so as to effect a patterning treatment on the Cr/Cu/Ni wiring layer 22, thereby forming a first layer wiring pattern 22a.

In detail, a resist (Trade Name: AZ350, made by Clariant) was applied to the wiring layer to form a coat having a thickness of 3 $\mu$m. Then, the wiring layer was baked at a temperature of 90° C. for 30 minutes. Afterwards, a predetermined mask was used to carry out an exposure, followed by development, thereby forming a desired resist pattern (not shown). Subsequently, the resist pattern was used as a mask to perform an etching treatment on Cr/Cu/Ni wiring layer 22, using an etching liquid which was a ferric chloride. After that, a resist stripping liquid was used to strip the resist, followed by water washing and drying, thereby obtaining the first layer wiring pattern 22a.

Figure 3C:
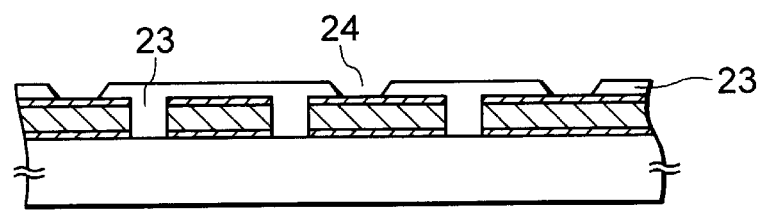

Next, as shown in FIG. 3C, a photo-sensitive polyimide precursor was applied by a spinner to the first layer wiring pattern 22a, so as to form a coating layer having a thickness of 10 $\mu$m, thereby obtaining a polyamide insulating layer 23. Afterward, contact holes 24 were formed on the polyamide insulating layer 23.

In detail, the applied photo-sensitive polyimide was baked at a temperature of 80° C. for 30 minutes. Then, a predetermined mask was used to conduct an exposure, followed by a development treatment, thereby forming the contact holes 24. Afterwards, a curing treatment was carried out in a nitrogen atmosphere at a temperature of 350° C. for 4 hours, thereby effecting a complete polyimidization of the above photo-sensitive polyimide precursor. At this time, the thickness of the polyimide insulating film 23 after curing was found to have been reduced by half (5 $\mu$m).

Subsequently, using the same plasma treatment as in Example 1, the surface of the polyimide layer was roughened for the purpose of obtaining a strong adhesion with a second wiring layer which is to be formed during a next step, while at the same time removing some organic substances such as residues of polyimide and development liquid remaining within the contact holes 24. It was confirmed by visual observation that the plasma treatment was able to completely remove the organic substances such as residues of insulating layer and development liquid remaining within the contact holes.

Figure 3D:
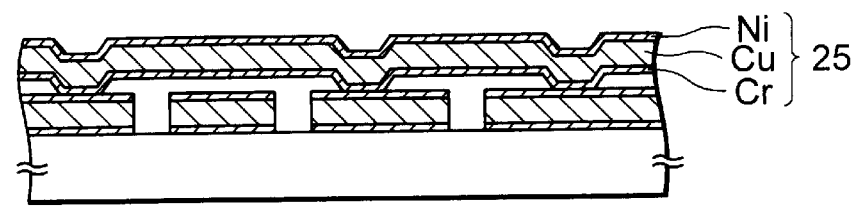

Next, as shown in FIG. 3D, the same steps as illustrated in the above FIG. 3A was carried out to form a Cr/Cu/Ni wiring layer 25.

Figure 3E:
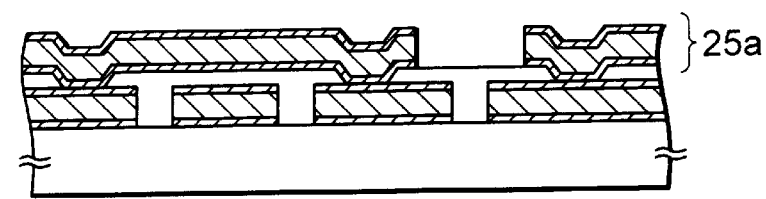

Then, as shown in FIG. 3E, the same steps as illustrated in the above FIG. 3B was carried out to pattern the Cr/Cu/Ni wiring layer 25 to form a second layer wiring pattern 25a.

Subsequently, the above steps 3C to 3E are repeated to successively form a second polyimide insulating layer, contact holes and a third layer wiring pattern, thereby obtaining a three-layer glass wiring substrate (not shown).

Afterwards, merely the contact terminal portions of the third layer wiring pattern were subjected to a non-electrolytic plating treatment, so as to form an Au film of 0.3 $\mu$m on the Ni film of 1 $\mu$m (not shown), thereby preventing the oxidation of the contact terminal portions and improving their electric contactability with an anisotropic electrically conductive film.

Finally, polyamide was applied (not shown) to the substrate to form an insulating film. Then, polyimide on the contact terminal portions was removed so as to form a protective insulating film, thereby obtaining a multi-layered wiring substrate for use in a wafer batch contact board.

Bonding an Anisotropic Electrically Conductive Rubber Sheet

Next, an anisotropic electrically conductive rubber sheet, which was made of a silicon resin and was so formed that metal particles were buried in the pad electrodes, was bonded to a predetermined position of the multi-layered wiring substrate for use in a wafer batch contact board.

Producing a Contact Element for Use in a Wafer Batch Contact Board

Next, a method for producing a contact element for use in a wafer batch contact board will be described in detail with reference to FIGS. 4A to 4C.

At first, as shown in FIG. 4, a silicon rubber sheet 16 having a uniform thickness of 5 mm was placed over an aluminum plate 15 having a high flatness.

On the other hand, for example, the polyimide film having a thickness of 25 $\mu$m was coated with a copper film having a thickness of 18 $\mu$m, using sputtering treatment or plating treatment, thereby obtaining a multi-layered film 17 (laminated body).

In practice, a material and a method for forming the film 17, as well as the thickness of the film 17 can be selected properly. For example, it is allowed to use a polyimide film or an epoxy resin film having a thickness of 12 to 50 $\mu$m, or a silicon rubber sheet having a thickness of 0.1 to 0.5 mm. The above films may be formed using a coating process, or it is allowed to directly use a commercially available film or sheet. Further, after a polyimide precursor is cast on to a copper foil, and then the polyimide precursor is heated, dried and cured, it is possible to obtain a film having a structure in which the copper foil and polyimide layer are bonded together. Moreover, a plurality of electrically conductive metal films may be successively formed on one side of the film, thereby making it possible to use a structure in which a plurality of electrically conductive metal layers have been laminated on one side of the film.

Furthermore, in order to improve the adhesion between the polyimide and Cu, and to prevent the film from being contaminated, it is allowed to form a thin Ni film, although not shown in the drawing.

Next, the film 17 of a structure in which the copper layer and the polyimide layer have been bonded together, is unfolded and spread out so as to be adsorbed to the above silicon rubber sheet 16, with the copper layer side located down. At this time, it is permitted to make use of the property that the film 17 will be adsorbed to the silicon rubber sheet 16. Further, in order to prevent any wrinkles and deflections, the adsorption is performed under a condition in which air layer is being continuously expelled, thereby effecting a desired adsorption with the film 17 being uniformly spread out.

Then, a thermosetting adhesive agent 18 is thinly and uniformly applied to an adhering surface of a ring member 11 formed of SiC and having a diameter of 8 inches and a thickness of 2 mm, thereby obtaining a coating layer having a thickness of 50 to 100 $\mu$m. The ring member is thus placed over the film 17. Here, the thermosetting adhesive agent 18 is an adhesive which will get hardened at a temperature 0 to 50 degrees higher than a temperature range of 80 to 150° C. (set for burn-in test). An adhesive agent used in this example is BOND HIGH TIP HT-100L (main agent: curing agent= 4:1) (manufactured by Konishi Co., Ltd.).

Furthermore, an aluminum plate (weight: 2.5 kg) having a high flatness is used as a heavy stone and placed on the ring 11 (not shown).

The materials treated in the above preparation steps are heated at a temperature (for example, 200° C.) for 2.5 hours, which is equal to or higher than a temperature (80 to 150° C.) set for the burn-in test, thereby bonding together the film 17 and the ring 11 (FIG. 4B).

At this time, since the thermal expansion coefficient of the silicon rubber sheet 16 is larger than that of the film 17, the film 17 adsorbed by the silicon rubber sheet 16 will receive a thermal expansion in the same extent as the silicon rubber sheet 16. Namely, as compared with a condition in which the film 17 is simply heated at a temperature which is equal to or higher than a temperature (80 to 150° C.) set for the burn-in test, since the thermal expansion coefficient of the silicon rubber sheet is relatively large, the polyimide film will expand to a larger extent due to an existing stress. Under a condition in which such a tension is large, the thermal setting adhesive agent 18 is cured, thereby effecting an adhesion between the film 17 and the ring 11. Moreover, since the film 17 on the silicon rubber 16 is adsorbed under a condition where it has been uniformly spread out without any wrinkle, deflection and loose, the film 17 can exactly adhere to the ring 11 without causing any wrinkle, deflection and loose. In addition, since the silicon rubber sheet 16 has a high flatness and a desired flexibility, the film 17 can be uniformly bonded to the adhering surface of the ring 11 without any surface irregularity (unevenness). Here, the tension of the polyimide film was set at 0.5 kg/cm$^2$.

On the other hand, in the case where the thermosetting adhesive agent is not used, since the film itself will shrink and its tension will be weakened, and since different portions of the adhesive agent will be hardened at different timings, it is difficult for the film to be bonded to the adhering surface of the ring.

The materials treated in the above heating and bonding steps are cooled to the room temperature and is caused to shrink until it changes back to its former state (when it has not yet been heated). Afterwards, a cutter is used to cut along the outer periphery of the ring 11 so as to remove the film's outer portions located on the outside of the ring 11, thereby producing an intermediate product (membrane ring) in which a laminated body has been spread over a support frame (FIG. 4C).

Next, the steps for treating the above membrane ring as well as forming the bumps and pads will be described in the following with reference to FIGS. 5A to 5G.

Figure 5A:
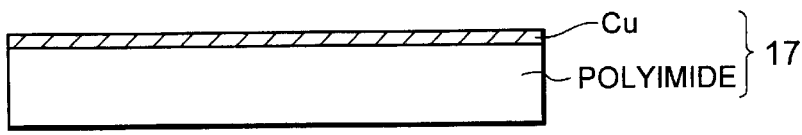
FIGS. 5A to 5G are important portion sectional views showing an intermediate product formation process in which a laminated body obtained in one example of the present invention has been spread over a support frame.
Figure 5B:
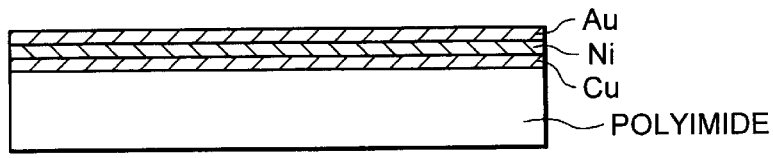

At first, as shown in FIG. 5A, on the copper foil (Cu) of the film 17 (laminated body) formed by bonding together the copper foil and the polyimide film, an electrolytic plating treatment is carried out in a manner as shown in FIG. 5B, thereby at first forming Ni layer having a thickness of 0.2 to 0.5 $\mu$m (preferably, 0.1 to 3 $\mu$m), then forming Au layer having a thickness of 0.1 to 0.5 $\mu$m (preferably, 0.5 to 2 $\mu$m), thus obtaining a laminated structure including polyimide film and Au/Ni/Cu.

Figure 5C:
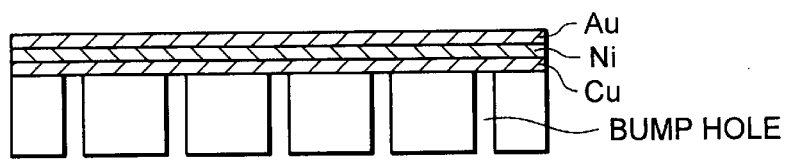

Subsequently, as shown in FIG. 5C, excimer laser is used to perform a laser treatment to form, on the predetermined positions of the polyimide film, a plurality of bump holes each having a diameter of 30 $\mu$m.

Afterwards, the interiors of the bump holes and the surface of the polyimide film are subjected to the same plasma treatment as carried out in Example 1. As a result, since the film 17 (laminated body) does not warp or deflect, it is possible to completely remove polyimide decomposition products ("soot" and "dregs" mainly containing carbons) occurred due to laser treatment and adhered in and around the bump holes.

Figure 5D:
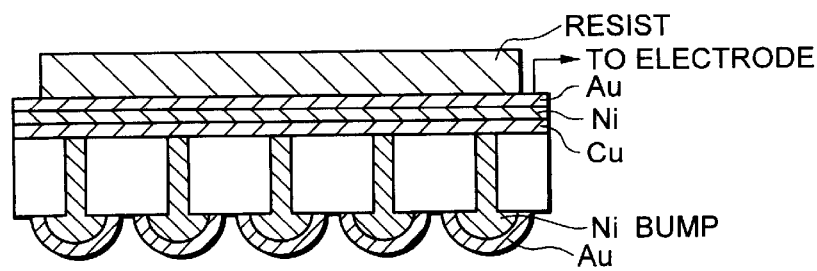

Then, as shown in FIG. 5D, in order that the surface of Au film (the uppermost layer) will not be plated, a protection film such as a resist is applied to the entire surface of the Au film except its predetermined portions (which are later used as electrodes), thereby forming a protection layer having a thickness of 2 to 3 $\mu$m.

The above treated material is then dipped into an ethanol solution so as to fill the bump holes with the ethanol solution. After that, the ethanol solution remaining within the bump holes were replaced with water. Subsequently, the above treated material is dipped in an acid so as to remove oxide film, followed by water washing to remove the acid.

Immediately after the above steps, one electrode is connected to the Au film (the uppermost layer) so as to perform the electrolytic plating of Ni or Ni alloy on the polyimide side. In practice, the plating conditions may be properly selected. For example, it is allowed to add a gloss agent, boric acid, nickel bromide and PH regulating agent in the plating liquid. Moreover, by regulating the content of the gloss agent in the plating liquid, it is possible to change the hardness and surface state of the bumps. In this way, after the plating material has grown to fill the bump holes in a manner shown in FIG. 5D, the plating material will arrive at the surface of the polyimide film, and soon spread equivalently in every direction to grow into generally semi-spherical shapes, thereby forming a plurality of bumps consisting of Ni or Ni alloy such as Ni—Co alloy and having a hardness of 600 Hv. Subsequently, an electrolytic plating layer consisting of Au having a thickness of 1 to 2 $\mu$m is formed on the surfaces of bumps. After that, although not specifically shown in the drawings, the above protection layer was stripped.

Figure 5E:
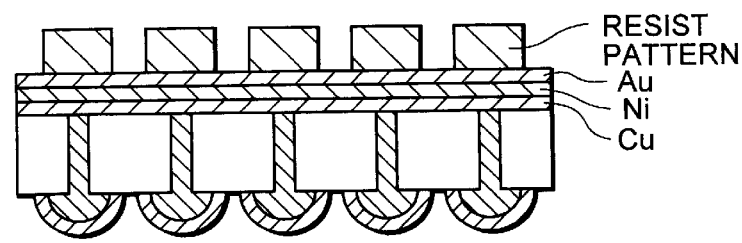

Afterwards, the resist is again applied to the entire surface of the Au layer (the uppermost layer), and some portions of the resist not corresponding to the formation of the pads are removed by virtue of exposure and development, thereby forming a resist pattern on the pad formation section, as shown in FIG. 5E.

Figure 5F:
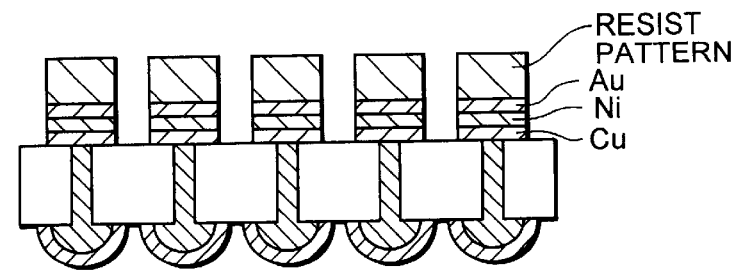
Figure 5G:
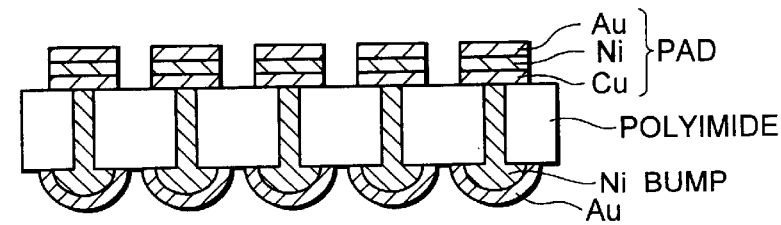

Then, as shown in FIG. 5F, the Au film is etched using an iodine potassium iodide solution, thus etching thin Ni film and Cu film existing between Au and Cu by virtue of the ferric chloride solution or the like. After rinsing treatment, the above resist was stripped, thereby forming pads consisting of Au (thickness: 1 $\mu$m)/Ni (thickness: 1.5 to 2.0 $\mu$m)/Cu, as shown in FIG. 5G. At this time, if the etching treatment is carried out by spraying, it is possible to reduce an undesired side etching. Therefore, an etching treatment by spraying is preferable.

After treating in the above steps, the contact element are thus completed which can be used in a wafer batch contact board.

Assembling Operation

The multi-layered wiring substrate having an anisotropic electrically conductive rubber sheet, and the contact element (for use in a wafer batch contact board) are brought together to be positionally aligned with each other in a manner such that the pad electrodes do not deviate from their correct positions. Upon being bonded together, the desired wafer batch contact board is thus completed.

Burn-in Test

After a positional alignment has been achieved between the pads of the wafer on one hand and the bumps of the contact element (for use in a wafer batch contact board) on the other, they are fixed together by means of a chuck and moved as such into a burn-in apparatus, so as to be subjected to the burn-in test in an operational environment of 125° C. In this way, it is possible to measure semiconductor devices which may be, for example, micro-computer, ASIC and memory formed on the wafer.

Furthermore, a flying probe was used to detect and measure whether there were existing some open portions, but it was found that there was no open portions usually caused due to contact holes of the multi-layered wiring substrate. Moreover, it was found that there was not any lacking bumps usually caused due to repeated contact, nor was there any contact failure usually caused due to defective bumps.

However, the present invention should not be limited to the above described examples, but can be put into practical use in some modified embodiments.

For example, it is allowed to properly select plasma treatment conditions such as atmosphere gas, gas pressure, high frequency output, substrate temperature, plasma treatment time, and to use various materials in order to achieve some predetermined effects.

Moreover, the number of laminated wiring layers in the multi-layered wiring substrate (for use in a wafer batch contact board) should not be limited to three layers, but can be set as many as desired (usually 2 to 5 layers)

Furthermore, the contact element of the present invention may be used to check CSP (Chip Size Package), BGA (Ball Grid Array), and IC substrate having solder balls (serving as contact points), can also be used as tape carrier for checking one chip burn-in, and further be used as burn-in probe card as well as membrane probe card.

In addition, the wafer batch contact board of the present invention may be used to perform product examination (electric property test) which was in a prior art conducted using a conventional probe card, also can be used for batch CSP examination of wafer level.

Furthermore, the multi-layered wiring substrate of the present invention can also be used as a multi-layered wiring substrate for MCM (multi-chip module) which is useful for high density mounting.

According to the method for manufacturing the contact element of the present invention, the use of the plasma treatment and/or X-ray (soft X-ray) irradiation is effective for removing in a short time the organic substances existing on the plated surface, and organic substance removal effect has been proved to be satisfactory. In particular, using the plasma treatment and/or X-ray (soft X-ray) irradiation makes it possible to completely remove the organic substances adhered to the surface of the insulating film and/or within the bump holes, as well as the residues occurred during the laser treatment. Further, with the use of the plasma treatment and/or X-ray (soft X-ray) irradiation, the plated surfaces of the bump holes can be wetted more easily. As a result, it becomes possible to greatly reduce ungrown bumps which will otherwise be caused due to incomplete filling of the bump holes with the plating liquid, as well as insufficient growth of bumps which will otherwise be caused due to insufficient filling of the bump holes with the plating liquid. Further, it is also possible to greatly reduce the defect contact points such as deformed bumps which will otherwise be caused due to a fact that during the plating treatment, air bubbles will adhere to the surface of the insulating resin layer adjacent to the bump holes. For this reason, the method of the present invention is effective for forming bumps with a high precision.

Particularly, in the case where it is needed to manufacture a contact element (for use in a wafer batch contact board) which requires the formation of many bumps for one product, it has become possible to improve its production yield (such yield was low in prior art).

Further, according to the method for manufacturing the multi-layered wiring substrate of the present invention, the use of the predetermined plasma treatment and/or X-ray (soft X-ray) irradiation is effective for removing organic substances, avoiding a conduction failure possibly caused due to the contact holes, as well as adhesion failure of the electrically conductive layer. Further, since it is possible to properly make rough the treated surface to an appropriate extent by carrying out the plasma treatment, it can be made sure to obtain an improved combinability between the treated surface and the electrically conductive layer.

Finally, with the use of the wafer batch contact board of the present invention, since it is allowed to use the contact element and the multi-layered wiring substrate having a high reliability and a high yield, it is possible to obtain a wafer batch contact board which can be manufactured at a low cost but has a high reliability as well as a high yield.

What is claimed is:

1. A method for manufacturing a contact element which has a plurality of bumps formed by carrying out plating within bump holes bored at predetermined positions on an insulating film, comprising the steps of:

forming a laminated body including the insulating film and at least one electrically conductive layer;

forming, in the predetermined positions of the insulating film, the bump holes extending from the surface of the insulating film to the at least one electrically conductive layer;

performing surface treatment by treating at least one of the interior of the bump holes and the surface of the insulating film by plasma to roughen and sufficiently wet a plating liquid used in the plating; and forming the bumps by the plating on the bump holes treated by the plasma.

2. A method for manufacturing a contact element according to claim 1, wherein the bump holes are formed through a laser treatment.

3. A method for manufacturing a contact element according to claim 1, wherein after the surface treatment performed by carrying out the plasma treatment to treat the interior of the bump holes and/or the surface of the insulting film, an oxide film removal treatment is carried out prior to the plating, for removing an oxide film from an electrically conductive layer exposed to the bottoms of the bump holes, and followed by forming bumps on the bump holes by using the electrolytic plating as the plating, with the electrically conductive layer kept as an electrode.

4. A method for manufacturing a contact element according to claim 1, further comprising a step of spreading the laminated body over a support frame.

5. A method according to claim 1, wherein the insulating film is formed by a material roughened by the surface treatment performing step, wherein the surface treatment performing step is carried out to roughen at least one of the interior of the bump holes and the surface of the insulating film.

6. A method according to claim 5, wherein the surface treatment performing step is specified by the plasma treatment effected in an atmosphere of either an oxygen atmosphere or an oxygen inclusion atmosphere that is kept at a gas pressure between 0.1 and 0.45 Torr.

7. A method according to claim 6, wherein the plasma treatment is performed in the atmosphere of a mixed gas comprising an oxygen gas and a gas including fluorine atoms in its molecules.

8. A method according to claim 7, wherein the gas including fluorine atoms in its molecules is included by 0.1 vol % to 50 vol % in the mixed gas.

9. A method according to claim 7, wherein the gas including fluorine atoms in its molecules is included by 1 vol % to 20 vol % in the mixed gas.

10. A method according to claim 5, wherein the insulating film comprises a resin material.

11. A method according to claim 10, wherein the insulating film has a thickness between 5 and 200 μm while each diameter of the bump holes falls between 5 and 200 μm.

12. A method for manufacturing a multi-layered wiring substrate which is formed by at first laminating, on an insulating substrate material, a plurality of electrically conductive layers with an insulating layer interposed therebetween, then depositing electrically conductive layers through a plurality of contact holes formed in the insulating the layer, the method comprising:

a surface treatment which is effected by carrying out a plasma treatment to roughen the interior of the contact holes and/or the surface of the insulating layer in an atmosphere of a mixed gas formed by an oxygen gas and another gas containing halogen atoms in its molecules; and a plating treatment which is carried out by a plating liquid, with both of the interior and/or the surface of the insulating layer that are roughened and that are sufficiently wetted by the plating liquid.

13. A method according to claim 12, for manufacturing a multi-layered wiring substrate forming part of a wafer batch contact board which is for use in the batch examining of numerous semiconductor devices formed on a wafer, the method comprising the steps of:

forming a first electrically conductive layer on an insulating substrate, patterning the first electrically conductive layer to form a first wiring pattern;

forming an insulating layer on the first wiring pattern and forming contact holes in the insulating layer;

performing a surface treatment which is effected by carrying out the plasma treatment to treat and roughen the interior of the contact holes and/or the surface of the insulating layer; and forming a second electrically conductive layer on an insulating substrate, patterning the second electrically conductive layer to form a second wiring pattern;

wherein a series of processes including the step of forming the insulating film and the contact holes, the step of performing the surface treatment and the step of forming the second wiring pattern are repeated at least once.

14. A method according to claim 12, wherein the insulating layer is formed by a material to be the surface treatment;

the surface treatment being performed to roughen the interior of at least one of each bump hole and the surface of the insulating layer.

15. A method according to claim 14, wherein the surface treatment is performed with a gas pressure kept at a range between 0.1 and 0.45 Torr.

* * * * *

UNITED STATES PATENT AND TRADEMARK OFFICE
CERTIFICATE OF CORRECTION

PATENT NO. : 6,406,991 B2
DATED : June 18, 2002
INVENTOR(S) : Osamu Sugihara

It is certified that error appears in the above-identified patent and that said Letters Patent is hereby corrected as shown below:

Column 25,
Line 12, change "insulting" to -- insulating --.

Column 26,
Line 5, delete "the" (first occurrence).

Signed and Sealed this

Eighteenth Day of March, 2003

JAMES E. ROGAN
*Director of the United States Patent and Trademark Office*